(12) United States Patent
Tryson et al.

(10) Patent No.: US 8,421,316 B2
(45) Date of Patent: Apr. 16, 2013

(54) TRANSDUCER COMPRISING A COMPOSITE MATERIAL AND METHOD OF MAKING SUCH A COMPOSITE MATERIAL

(75) Inventors: Michael Tryson, Hanover, PA (US); Mohamed Benslimane, Nordborg (DK); Hans-Erik Kiil, Aabenraa (DK); Michael Allen Zumbrum, New Oxford, PA (US)

(73) Assignee: Danfoss PolyPower A/S, Nordborg (DK)

( * ) Notice: Subject to any disclaimer, the term of this patent is extended or adjusted under 35 U.S.C. 154(b) by 0 days.

(21) Appl. No.: 12/996,711

(22) PCT Filed: Jun. 4, 2009

(86) PCT No.: PCT/DK2009/000131
§ 371 (c)(1),
(2), (4) Date: Apr. 27, 2011

(87) PCT Pub. No.: WO2010/000261
PCT Pub. Date: Jan. 7, 2010

(65) Prior Publication Data
US 2011/0198971 A1    Aug. 18, 2011

Related U.S. Application Data

(60) Provisional application No. 61/059,951, filed on Jun. 9, 2008.

(51) Int. Cl.
*H01L 41/047* (2006.01)
(52) U.S. Cl.
USPC .......... 310/364; 310/309; 310/363; 310/365; 310/800

(58) Field of Classification Search ............ 310/309, 310/363–365, 800
See application file for complete search history.

(56) References Cited

U.S. PATENT DOCUMENTS

| 3,898,722 A | 8/1975 | Foote |
| 4,786,837 A * | 11/1988 | Kalnin et al. ............... 310/364 |
| 5,319,153 A * | 6/1994 | Fishman ..................... 84/731 |

(Continued)

FOREIGN PATENT DOCUMENTS

EP    1919072 A1    5/2008

OTHER PUBLICATIONS

Ul-Haq S. et al, Breakdown pattern identification in high temperature dielectric films using scanning electron microscopy (SEM), 2003 Annual Report Conference on Electrical Insulation and Dielectric Phenomena, 265-268, Department of Electrical and Computer Engineering, University of Windsor, Windsor, Ontario, Canada, N9B 3P4.

(Continued)

*Primary Examiner* — Thomas Dougherty
(74) *Attorney, Agent, or Firm* — McCormick, Paulding & Huber LLP

(57) ABSTRACT

The invention provides a transducer for converting between mechanical and electrical energies. The transducer comprises an EAP laminate with a layer of an elastomer material arranged between two electrode layers, each electrode layer comprising a second layer of a plastically deformable material, e.g. metal or a thermoplastic material, and a third layer of an electrically conductive material. Due to the layer of plastically deformable material, the electrode layers can be shaped into various shapes which can provide anisotropic characteristics of the transducer.

18 Claims, 3 Drawing Sheets

U.S. PATENT DOCUMENTS

| | | | |
|---|---|---|---|
| 6,376,971 | B1 | 4/2002 | Pelrine et al. |
| 6,511,709 | B1* | 1/2003 | Barnes et al. ............. 427/430.1 |
| 2005/0157893 | A1 | 7/2005 | Pelrine et al. |
| 2009/0130423 | A1* | 5/2009 | Keady ..................... 428/304.4 |
| 2011/0232744 | A1* | 9/2011 | Larsen et al. ................ 136/256 |

OTHER PUBLICATIONS

Jean-Mistral C. et al, Dielectric polymer: scavenging energy from human motion, Electroactive Polymer Actuators and Devices (EAPAD) 2008, edited by Yoseph Bar-Cohen Proc. of SPIE vol. 6927, 692716, (2008).

Yu M, et al, Nonlinear analysis of sensor diaphragm under initial tension, Department of Mechanical Engineering, University of Maryland, Smart structures and Materials 2005: Modeling, Signal Processing, and Control, edited by Ralph C. Smith, Proc. of SPIE vol. 5757 (SPIE, Bellingham, WA, 2005).

International Search Report for PCT/DK2009/000131 dated Oct. 7, 2009.

Danish Search Report for PA200800757 Jan. 14, 2009.

U.S. Appl. No. 12/990,333, filed Apr. 26, 2011 and entitled A Power Actuated Valve.

U.S. Appl. No. 12/990,300, filed Apr. 26, 2011 and entitled A Pump Powered by a Polymer Transducer.

* cited by examiner

TRANSDUCER COMPRISING A COMPOSITE MATERIAL AND METHOD OF MAKING SUCH A COMPOSITE MATERIAL

CROSS REFERENCE TO RELATED APPLICATIONS

This application is entitled to the benefit of and incorporates by reference essential subject matter disclosed in International Patent Application No. PCT/DK2009/000131 filed on Jun. 4, 2009 and U.S. Provisional Patent Application No. 61/059,951 filed on Jun. 9, 2008.

FIELD OF THE INVENTION

The invention relates to an elastomer transducer for converting between mechanical and electrical energies. The invention further relates to a composite material for such a transducer and to a method of manufacturing such a composite material.

BACKGROUND OF THE INVENTION

An electrical potential difference between two electrodes located on opposite sides of an elastomer body may generate an electric field leading to a force of attraction and thus a deflection of the elastomer body under influence of Coulomb forces between the electrodes. Such composites of electrodes on an elastomer body can be used in various ways for actuation and sensing purposes. Used as a transducer, they are sometimes referred to as electroactive polymer transducers (EAP-transducers), or artificial muscles.

Typically, it is desired to provide compliance of the transducer to deflect in a specific direction. This is typically referred to as an anisotropic structure. To provide anisotropy of the transducer, a deflection control structure is introduced. The deflection control structure can be a rigid member which is applied to the elastomer body to limit deflecting in certain directions or the deflection control structure may be constituted by the electrodes which are formed so that deflection is primarily possible in specific directions.

U.S. Pat. No. 6,376,971 discloses a compliant electrode which is positioned in contact with a polymer in such a way, that when applying a potential difference across the electrodes, the electric field arising between the electrodes contracts the electrodes against each other, thereby deflecting the polymer. Since the electrodes are of a substantially rigid material, they must be made textured in order to make them compliant.

U.S. Pat. No. 6,376,971 discloses a planar compliant electrode being structured and providing one-directional compliance, where metal traces are patterned in parallel lines over a charge distribution layer, both of which cover an active area of a polymer. The metal traces and charge distribution layer are applied to opposite surfaces of the polymer. The charge distribution layer facilitates distribution of charge between metal traces and is compliant. As a result, the structured electrode allows deflection in a compliant direction perpendicular to the parallel metal traces. In general, the charge distribution layer has a conductance greater than the electroactive polymer but less than the metal traces.

Other EAP transducers are described e.g. in US 2004/0012301 in which a waved section is provided in a body of an elastomer material. The waved shape provides compliance of the transducer in a specific direction.

The structure or shape of the deflection control structure, and thus the designed anisotropy of the known transducers are typically provided in relatively complicated processes, e.g. involving coating of various layers in a specific micro pattern. This is complicated and may cause faults in the structure and thus reduced performance of the transducer, not least when the deflection control structure is constituted by the electrodes of the composite material.

SUMMARY OF THE INVENTION

It is an object of the present invention to provide a transducer with an alternative composite material and to provide a method of making a composite for a transducer. In particular, it is an object to provide a transducer which can be made in an efficient way, and to provide an alternative way of making the deflection control structure and thus to provide anisotropy.

According to a first aspect, the invention provides a transducer for converting between mechanical and electrical energies, the transducer comprising a laminate with a first layer of an elastomer material arranged between two electrode layers, each electrode layer comprising a second layer of a plastically deformable material and a third layer of an electrically conductive material.

Since the second layer is of a plastically deformable material, it is possible to shape this layer by heating it up. In such a shaping process, heating enables shaping of the plastically deformable material to provide a specific shape which is preserved after the plastic deformation.

The plastically deformable material could e.g. be a metal material or a plastic material or in general, any kind of material which may be reshaped by plastic deformation so that the provided new shape is preserved.

By plastic deformation is herein meant that the material remains deformed after a load is added and then removed.

In one embodiment, the plastically deformable material is a thermo-formable material which herein means that it is more easily deformed upon heating, e.g. a thermoplastic material. By use of a thermoplastic material, the deformation may take place after heating of the material, and after a subsequent cooling, the shape of the thermoplastic material is fixed. A thermo-formable material may facilitate that the second layer may be reshaped by use of a relatively low pressure between a reshaping tool and the second layer, and therefore without or essentially without causing damage to the laminate.

It is well known, for example from the document EP 1919072, to introduce a number of layers in such a transducer, however it is not known to form the corrugations by introducing a layer being deformed without pre-strain in a manner, where the resulting waves of the layer has amplitudes being at least within the same order or range as the thickness of the layer itself. This leads to a shape of the layer affecting the hole of the layer body, not only the surface being processed.

It is also known to introduce corrugations by a stiff layer (for example the electrode) being attached to a pre-strained polymer, when relaxing the polymer then the stiff layer will 'bulk' or 'texture' into often irregular surface structures due to its un-elastic nature, one example is to be found in U.S. Pat. No. 6,376,971.

This layer, however, only shapes due to being fixed to the surface of the pre-strained polymeric material.

E.g. the plastically deformable material introduced in the present invention introduces a very different way to form surface structures, for example such as corrugations, in that shaping the plastically deformable material also shapes the surfaces of the layer(s) being attached thereto.

Once being formed with a specific shape, the plastically deformable material may constitute the deflection control structure and it may provide a direction depending compliance to deform, i.e. anisotropy.

By "having an anisotropic structure" it is meant: "having compliance to stretch in one direction and less compliance to stretch in another direction", i.e. it requires a lower force to stretch the laminate in the more compliant direction than in the less compliant direction or it is meant that the laminate can be stretched further in the compliant direction than in the less compliant direction without overstretching and potentially destroying the laminate.

Alternatively, the plastically deformable material may shape one of the other layers which then again may constitute the deflection control structure and provide direction depending compliance to deform. In particular, it is intended for the second layer to deflect the third layer of that electrode layer to which the second layer belongs.

By use of the plastically deformable material, it may therefore be possible to prepare at least a part of the laminate in a standardized process and subsequently to reshape the plastically deformable material in accordance with a specifically desired anisotropy.

When the second layer has been shaped, the third layer and possibly also at least a portion of the first layer may adopt the shape of the second layer, and optionally, the plastically deformable material may thereby be used for shaping a major part of the laminate or for shaping the entire laminate.

As an example, at least one of the first and second layers may be provided in a standard process, and these two layers could be joined in a standard process to form a standardized electrode layer. Optionally, the first layer may also be joined between such two electrode layers to form a standardized laminate with a standard anisotropy or completely without anisotropy. At this time, both the second and the third layer may be flat layers. At least the second layer may possibly be obtained as a commercially available standard product from a vendor of tapes or sheets of plastically deformable materials such as metal or thermoplastic materials. At a later point of time, the thermoplastic material is heated up and reshaped, e.g. by use of a vacuum forming process, and the anisotropy may thus be designed for a specific purpose.

The layers or the entire laminate could be made in a roll to roll process.

In one embodiment, the laminate has an elongated sheet-like shape which is longer in one, lengthways, direction than in a crossways direction being perpendicular to the lengthways direction, and which is relatively thin in a thickness direction being perpendicular both to the lengthways and crossways direction.

The anisotropic structure may in particular provide compliance in the lengthways direction or in the crossways direction. In particular, the composite may be provided in "endless" length meaning that it is very much longer in the lengthways direction than in other directions, e.g. a factor 1000, 10000 or even more in the lengthways direction than in the crossways direction.

In particular, the electrode layer may have a corrugated shape forming raised and depressed surface portions, e.g. extending in a crossways direction being perpendicular to the lengthways direction, and the shape or size or both the shape and size can vary periodically along at least one direction, e.g. the direction perpendicular to the crossways direction.

The third layer may be located between the second and first layers. However, for the purpose of supplying an electrical potential to the third layer, it may be an advantage to arrange the third layer so that it forms a conductive outer surface of the laminate.

Since the third layer is electrically conductive, it may be desired to provide this layer in a metallic material. Since such materials are typically less elastically deformable than elastomer materials, it may be desired to use the third layer as the deflection control structure or at least to have the third layer form part of the deflection control structure. It may therefore be desired to shape the third layer in accordance with a desired anisotropy.

To use the second layer in a process of shaping the third layer, it may be an advantage to locate the second layer between the third layer and the first layer. This allows the second layer to be shaped by a shaping tool which is pressed against an outer surface of the third layer.

It may further be an advantage to provide the third layer with a thickness in the range of $1/10$-$1/1000$ of that of the second layer. When the second layer is shaped, the relatively low thickness of the third layer may trigger that also the third layer is shaped, or it may at least facilitate that the second layer is sufficiently rigid to hold the third layer in that shape which is formed in the second layer.

The efficiency of the transducer depends e.g. on the degree of deflection of the first layer. This again depends on the thickness of the first layer and on the modulus of elasticity of the first layer. It has been found advantageous to provide the first layer with a thickness being 10 to 100 times the thickness of the second layer, and to make the modulus of elasticity of the first layer much lower than that of the second layer, e.g. so that the modulus of elasticity of the second layer is in the range of 10 to 100 times higher than the modulus of elasticity of the first layer. Further, it has been found advantageous to provide the second layer with a dielectric breakdown which is higher than that of the first layer, again e.g. a factor 1, 5 to 100 higher.

The second layer may comprise a film selected from a group consisting of DuPont™ Teflon™ PFA films.

The second and third layer may be constituted at least partly by a standard polyethylene terephthalate metallised film e.g. from the company Goodfellow (c.f. www.goodfellow.com), e.g. a film of polyethylene terephthalate constituting the second layer and a metallization layer of aluminium, copper, silver or similar conductive material constituting the third layer.

The first layer may comprise a gel material such as a silicone gel material.

The first and second layers may further comprise a material selected from a group consisting of block copolymers and a block-selective oligomer.

When the laminate is ready, the third layers of the two electrode layers serve as electrodes, and the second and first layers become deformable by coulomb forces when an electrical field is applied to the electrodes.

The laminate may be obtained by a stack of at least two composite materials where each composite material comprises a first layer of an elastomer material arranged against an electrode layer, where the electrode layer still comprises a second layer of a plastically deformable material and a third layer of an electrically conductive material. A stack of such two composite materials provides a structure with a first layer adjacent an electrode layer adjacent another first layer adjacent yet another electrode layer. Since the first mentioned first layer is not surrounded by electrode layers, this first mentioned first layer becomes inactive.

The mentioned stack of composite materials may contain any number above 2 of the mentioned composite materials, e.g. a number of 5-50 composite materials so that an electrical field can be applied over every second electrically conductive layer.

To finish the transducer, the electrically conductive layers need only to be wired so that an electrical potential can be applied. Depending on the desired structure and capacity of the transducer, the laminate may further be folded rolled or otherwise formed into a desired shape.

If the laminate is of the previously mentioned "endless" type, the transducer may be made by rolling the laminate to form a tubular or round transducer with a number of windings, e.g. 10-1000 windings. The laminate may either be rolled so that it is compliant in a direction which is parallel to the axial direction of such a rolled structure or so that it is most compliant in a direction perpendicular to the axial direction, e.g. a radial direction of the rolled structure.

In a second aspect, the invention provides a composite material for a transducer. The composite comprising a first layer of an elastomer material arranged against an electrode layer, the electrode layer comprising a second layer of a plastically deformable material and a third layer of an electrically conductive material.

In general the composite may comprise any of the features mentioned already with respect to the first aspect of the invention.

In a third aspect, the invention provides a method of making a composite material for an EAP-transducer, the method comprising the step of:
  providing a film of a plastically deformable material;
  applying a layer of a conductive material to an outer surface of the film;
  applying a layer of an uncured elastomer to an inner surface of the film;
  reshaping the film by plastic deformation, e.g. by use of a heated vacuum mould; and
  curing the elastomer.

Preferably, the elastomer and the conductive material are applied to the film prior to the reshaping. The steps are typically conducted in the order a) before b) before c) before d) before e). However, any of the steps b)-e) could be in any sequential order, e.g. a) before d) before b) before c) before e), or a) before c) before d) before b) before e) or a) before b) before d) before c) before e). In one embodiment, the elastomer is cured during the reshaping of the film.

The method may further comprise any step which is necessary to obtain a transducer or a composite material according to the first and second aspects of the invention.

DETAILED DESCRIPTION OF THE PREFERRED EMBODIMENT

Figure 1:
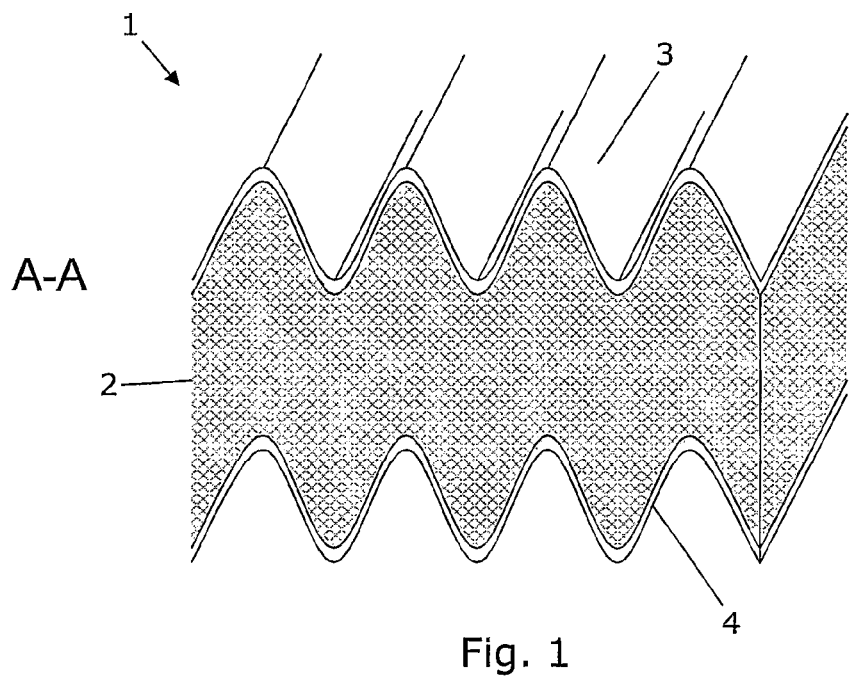
FIG. 1 illustrates a transducer for converting between mechanical and electrical energies.

In the following, preferred embodiments of the invention will be described in further details with reference to the drawing in which:

FIG. 1 illustrates a transducer 1 for converting between mechanical and electrical energies. The transducer comprising a laminate with a first layer 2 of an elastomer material arranged between two electrode layers 3, 4.

Figure 2:
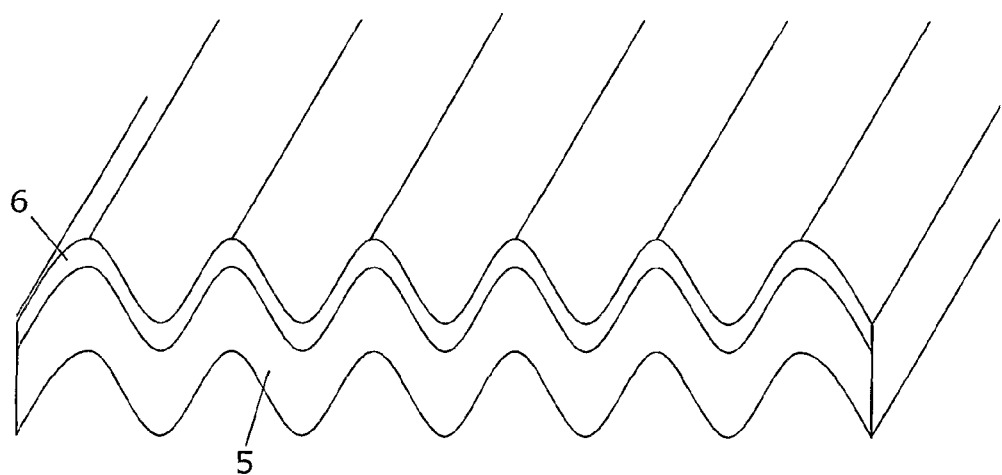
FIG. 2 illustrates one of the electrode layers.

FIG. 2 illustrates one of the electrode layers 3, 4 which both comprise a second layer 5 of a thermoplastic material and a third layer 6 of an electrically conductive material.

The third layer is relatively thin compared to the second layer, and since the second layer and the third layer are bonded strongly to each other, the third layer is easily deformed or reshaped when the second layer is reshaped. Since the second layer is a thermoplastic layer, it may be shaped by use of a hot embossing tool or a heated vacuum forming tool—in the following referred to as thermoforming. The first layer is preferably applied to at least one of the electrode layers 3, 4 prior to the thermoforming thereof.

Figure 3:
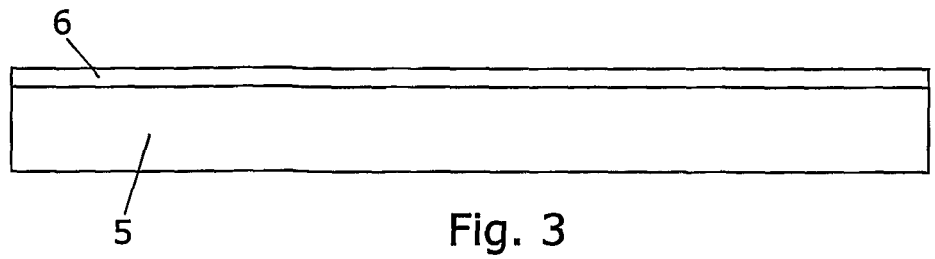
FIG. 3 illustrates an electrode layer with a thermoplastic layer and an electrically conductive layer which is still not reshaped.

FIG. 3 illustrates an electrode layer with a thermoplastic layer 5 and an electrically conductive layer 6 which is still not reshaped.

Figure 4:
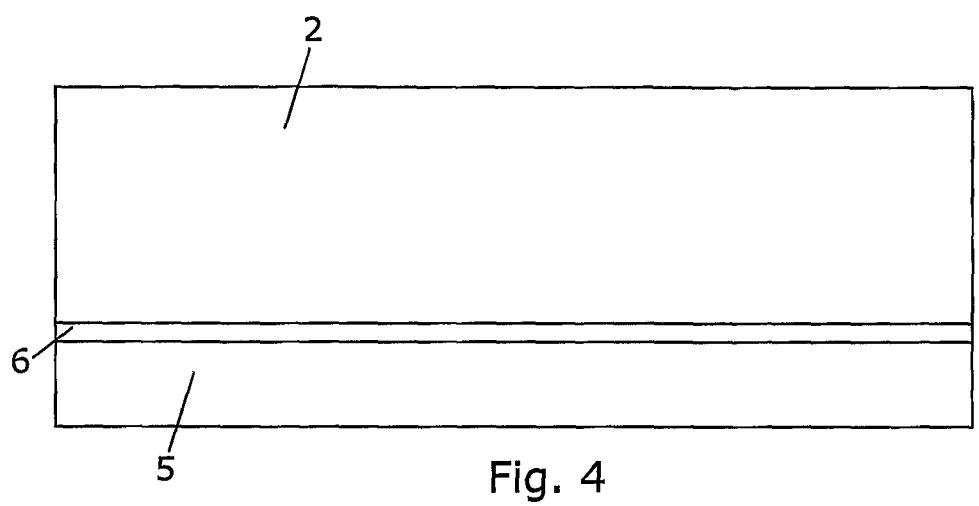
FIG. 4 illustrates a layer of an elastomer which is not yet cured or solidified has been applied to a surface of the electrically conductive layer.

In FIG. 4, a layer 2 of an elastomer which is not yet cured or solidified has been applied to a surface of the electrically conductive layer 6.

Figure 5:
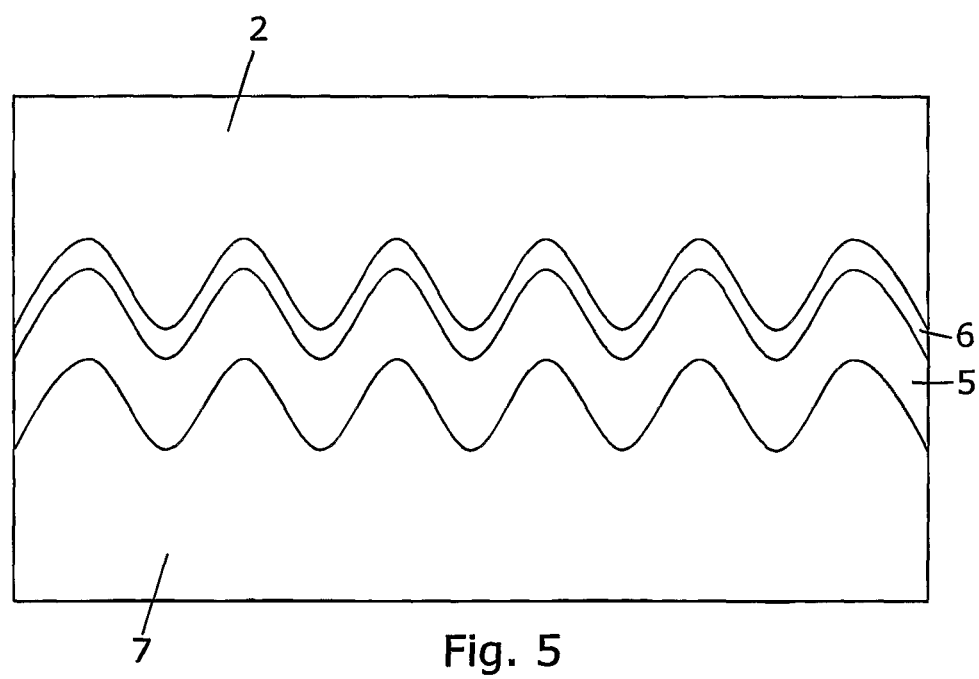
FIG. 5 illustrates the electrode layer in contact with a heated vacuum forming tool.

In FIG. 5, the electrode layer is in contact with a heated vacuum forming tool 7 which reshapes the electrode layer and provides a wave-shape which facilitates stretching in a direction perpendicular to the crests and troughs. At this stage, the layer 2 is hardened or solidified whereby it supports the newly formed shape of the electrode layer.

Alternatively, the elastomer layer is applied to the thermoplastic layer 5 and the electrode layer is reshaped by pressing the vacuum forming tool into the opposite side, i.e. into the electrically conductive layer 6.

Figure 6:
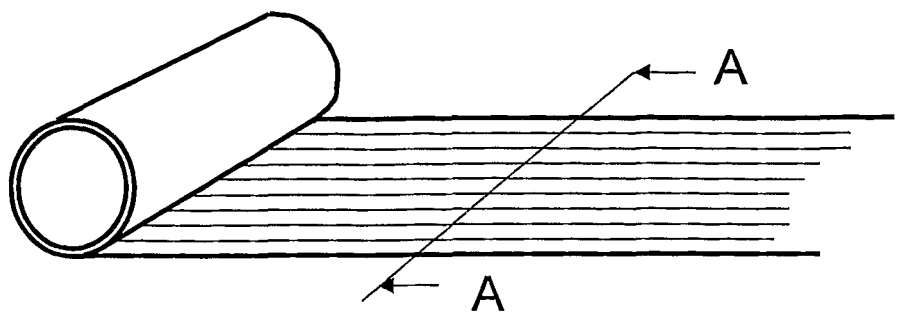
FIG. 6 illustrates that the laminate can be rolled, e.g. to form a cylindrical tubular transducer.

FIG. 6 illustrates that the laminate can be rolled, e.g. to form a cylindrical tubular transducer.

Figure 7:
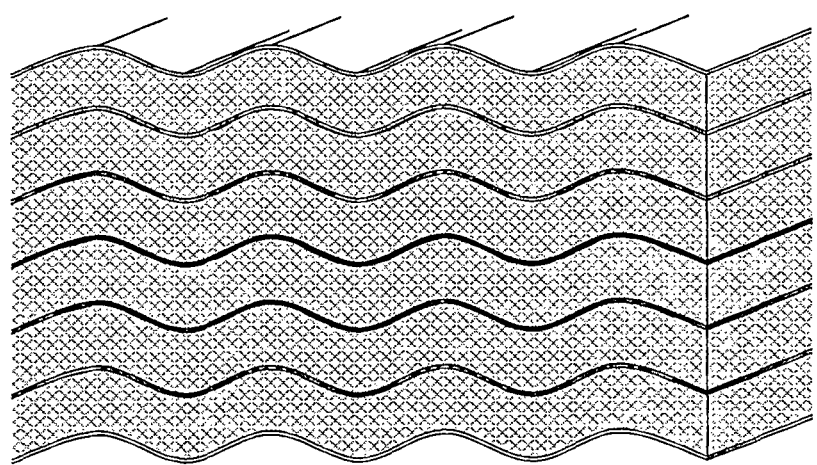
FIG. 7 illustrates that the transducer may comprise a large number of layers.

FIG. 7 illustrates that the transducer may comprise a large number of layers.

While the present invention has been illustrated and described with respect to a particular embodiment thereof, it should be appreciated by those of ordinary skill in the art that various modifications to this invention may be made without departing from the spirit and scope of the present.

What is claimed is:

1. A transducer for converting between mechanical and electrical energies, the transducer comprising a laminate with a first layer of an elastomer material arranged between two electrode layers, each electrode layer comprising a second layer of a plastically deformable material and a third layer of an electrically conductive material;
  wherein each electrode layer has a corrugated shape forming raised and depressed surface portions.

2. The transducer according to claim 1, wherein the plastically deformable material is a thermoplastic material.

3. The transducer according to claim 1, wherein the electrode layer has a shape which facilitates anisotropic stretching.

4. The transducer according to claim 1, wherein the third layer adopts the shape of the second layer.

5. The transducer according to claim 1, wherein the electrode layer has a shape and/or size which vary periodically along at least one direction.

6. The transducer according to claim 1, wherein the third layer forms a conductive outer surface of the laminate.

7. The transducer according to claim 1, wherein the third layer is located between the second layer and the first layer.

8. The transducer according to claim 1, wherein the third layer has a thickness in the range of $1/10$-$1/1000$ of that of the second layer.

9. The transducer according to claim 1, wherein the second layer has a thickness in the range of 1/10-1/100 of that of the first layer.

10. The transducer according to claim 1, wherein the second layer has a dielectric breakdown which is higher than that of the first layer.

11. The transducer according to claim 1, wherein the second layer has a higher modulus of elasticity than that of the first layer.

12. The transducer according to claim 1, wherein the second layer comprises a film selected from a group consisting of DuPont™ Teflon™ PFA films.

13. The transducer according to claim 1, wherein the first layer comprises a gel material.

14. The transducer according to claim 13, wherein the gel material is a silicone material.

15. The transducer according to claim 1, comprising a plurality of electrode layers alternating first layers.

16. A composite material for a transducer, the composite material comprising a first layer of an elastomer material arranged against an electrode layer, the electrode layer comprising a second layer of a plastically deformable material and a third layer of an electrically conductive material;
   wherein the electrode layer has a corrugated shape forming raised and depressed surface portions.

17. The composite material according to claim 16, wherein the plastically deformable material is a thermoplastic material.

18. The transducer made from a plurality of composite materials according to claim 16, the composite materials being arranged in a stack.

* * * * *